(12) United States Patent
Kobayashi et al.

(10) Patent No.: US 8,786,573 B2
(45) Date of Patent: Jul. 22, 2014

(54) DATA INPUT DEVICE OF ELECTRONIC DEVICE AND INPUT CONTROL METHOD

(75) Inventors: Tsunehisa Kobayashi, Nagano (JP); Kosuke Mizutani, Nagano (JP); Takamichi Kitano, Nagano (JP)

(73) Assignee: Minebea Co., Ltd., Nagano (JP)

(*) Notice: Subject to any disclaimer, the term of this patent is extended or adjusted under 35 U.S.C. 154(b) by 252 days.

(21) Appl. No.: 13/282,821

(22) Filed: Oct. 27, 2011

(65) Prior Publication Data

US 2012/0105368 A1 May 3, 2012

(30) Foreign Application Priority Data

Oct. 29, 2010 (JP) ................................ 2010-244564

(51) Int. Cl.
*G06F 3/044* (2006.01)
*G06F 3/041* (2006.01)
*H03K 17/96* (2006.01)

(52) U.S. Cl.
CPC .......... *H03K 17/9622* (2013.01); *G06F 3/0416* (2013.01); *H03K 2217/94026* (2013.01); *G06F 3/044* (2013.01)
USPC ....................................................... 345/174

(58) Field of Classification Search
CPC . G06F 3/03547; G06F 3/03548; G06F 3/041; G06F 3/0416; G06F 3/044
USPC .................... 345/173–174; 178/18.01–18.06; 324/658, 679, 686
See application file for complete search history.

(56) References Cited

U.S. PATENT DOCUMENTS

| | | | | |
|---|---|---|---|---|
| 8,164,573 B2* | 4/2012 | DaCosta et al. | ............... | 345/173 |
| 8,456,180 B2* | 6/2013 | Sitarski | ......................... | 324/679 |
| 2006/0227115 A1* | 10/2006 | Fry | ................................ | 345/173 |
| 2007/0001681 A1* | 1/2007 | Sato | .............................. | 324/457 |
| 2008/0165154 A1* | 7/2008 | Kim | .............................. | 345/173 |
| 2008/0266270 A1* | 10/2008 | Nakamura | ..................... | 345/173 |
| 2009/0073140 A1* | 3/2009 | Fujita et al. | ................... | 345/174 |
| 2009/0257088 A1 | 10/2009 | Tokashiki | | |
| 2010/0149130 A1* | 6/2010 | Jung et al. | ...................... | 345/174 |
| 2010/0225604 A1* | 9/2010 | Homma et al. | ............... | 345/173 |
| 2010/0289759 A1* | 11/2010 | Fisher et al. | .................. | 345/173 |
| 2011/0273395 A1* | 11/2011 | Chung | ........................... | 345/174 |

FOREIGN PATENT DOCUMENTS

| | | |
|---|---|---|
| JP | 11-212725 A | 8/1999 |
| JP | 2005-108036 A | 4/2005 |
| JP | 2005-317041 A | 11/2005 |
| JP | 2007-208682 A | 8/2007 |
| JP | 2009-253938 A | 10/2009 |
| JP | 2010-117842 A | 5/2010 |

OTHER PUBLICATIONS

Office Action issued on Feb. 26, 2014 in the corresponding JP Patent Application 2010-244564 with English translation thereof.

* cited by examiner

*Primary Examiner* — Hong Zhou
(74) *Attorney, Agent, or Firm* — Carrier Blackman & Associates, P.C.; Joseph P. Carrier; Jeffrey T. Gedeon (57) ABSTRACT

A data input device for an electronic device includes: a operation section having a plurality of capacitive touch sensors to detect a input operation; and a control circuit section that outputs output information corresponding to detected information of the input operation input from the operation section to the electronic device when it is determined that the input operation is performed, wherein the control circuit section is configured to configure arbitrarily a detection sensitivity of the touch sensor before determining whether the input operation is performed, wherein the control circuit section determines whether the input operation is performed in response to a magnitude of an input value of the detected information, based on the configured detection sensitivity, wherein, when it is determined that the input operation is performed, the control circuit section updates the detection sensitivity configured for the touch sensors based on the magnitude of the input value.

13 Claims, 3 Drawing Sheets

DATA INPUT DEVICE OF ELECTRONIC DEVICE AND INPUT CONTROL METHOD

CROSS-REFERENCE TO RELATED APPLICATION

This application claims priority from Japanese Patent Application No. 2010-244564 filed on Oct. 29, 2010, the entire subject matter of which is incorporated herein by reference.

TECHNICAL FIELD

The present disclosure relates to a data input device for an electronic device and an input control method of the data input device.

BACKGROUND

In one data input device for electronic devices having a display device such as liquid crystal device (LCD) and CRT, a data input device is disposed on a screen of the display device and is touched with a finger or the like while seeing through the screen (hereinafter, the data input device is referred to as touch panel, see JP-A-2005-317041 for example). When a character, number, and other symbol (which may include pictorial symbols called as icon configured by figures, images, and the like, and each of which may be configured by a plurality of symbols) displayed on a screen is touched, the touch panel generates and outputs information corresponding to a position of an intended character, number, or symbol.

For example, a touch panel type display has been widely used in an electronic device not only such as an ATM of banks and a car navigator but also in a small-sized electronic device such as portable information terminal and electronic dictionary.

Meanwhile, various proposals for implementing data input devices, in the touch panels is used without the display devices such as LCD and CRT, have been proposed. For example, the applicant have proposed a keyboard device, in which a display function is not required, having an input operation surface, which is provided at the top surface and has a flat surface as a touch panel type display (see JP-A-2009-253938).

A data input device using the touch panel is widely used in not only devices such as keyboard devices having various operation sections but also, for example, an operation section for a home appliance, a residential device, and the like, instead of a conventional data input device having a keycap (see JP-A-2007-208682)

The keyboard device disclosed in JP-A-2009-253938 and the data input device of the operation section of the home appliance, the residential device and the like use a capacitive touch sensor for implementing a flat input operation section having highly sensitive input detection. Since the flat input operation surface is flat, a cleaning is easy and a contamination is difficult to be fixed. Therefore, the appearance is improved and a clean condition can be maintained. That is, the keyboard device and the data input device achieve the functionality and aesthetics at high level.

Meanwhile, the capacitive sensor determines whether the operation is performed, based on a change of a detected capacitance. Therefore, the capacitive sensor has a unique problem, which has not appeared in the conventional data input devices detecting an input by receiving a displacement due to a touch of a keycap.

Figure 4:
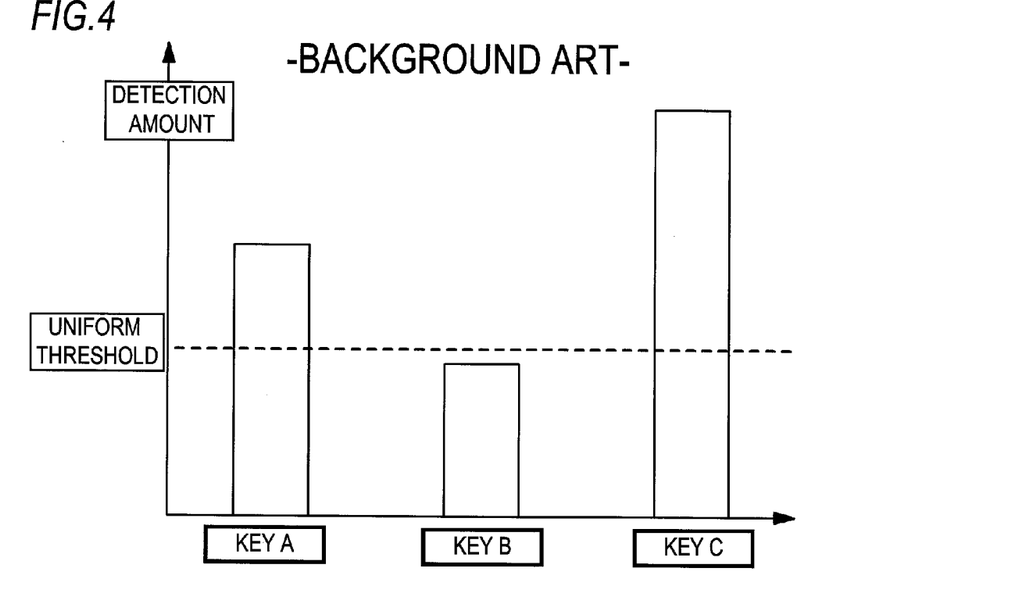
FIG. 4 is a diagram illustrating a problem due to a variation in detection amount among touch sensors in a data input device having capacitive touch sensors according to the background art.

For example, during manufacturing of touch sensors, the characteristics of each of the touch sensors, a variation in detection sensibilities due to component accuracy and the like may cause a variation in detection amount (detection value regarding capacitance) in each of the touch sensors for each key, as shown in FIG. 4. In an example of FIG. 4, a detection amount of the key C of the touch sensor is the largest, a detection amount of the key B of the touch sensor is the smallest, and a detection amount of the key A of the touch sensor is an intermediate value. In this case, if detection sensitivities of the touch sensors for determining whether the input operation is performed are defined by a uniform threshold, the input operation of the key B of the touch sensor cannot be detected. In view of the above, adjustments of the thresholds of the detection sensitivities of touch sensors are required before shipment of the data input device.

Even after shipment of the data input device, a variation in the detection amount among touch panels as shown in FIG. 4 may be caused by habits of operators and so on. Also, a similar variation may be caused by deformation of components due to a change of an environment in which the data input device is placed a change of a temperature or a humidity, for example. Therefore, if it is possible that the determined detection sensitivity of the touch sensors set before shipment (default state) is changed in accordance to a change of sensitivity caused by preferences of the operators and a change of the environment after the shipment, it is possible to improve the usability of the data input device significantly. On the other hand, if a change of detection sensitivity of the touch panels is allowed unlimitedly, it is feared that a change of capacitance with respect to input operation may be insufficient to receive the input operation, and thus intended operation cannot be performed.

The present disclosure was made in consideration of the above, and the present disclosure is provided to change appropriately the detection sensibility of the touch sensor in the data input device for an electronic device using capacitive touch sensors, without damaging the reliability.

SUMMARY

Illustrative aspects to be described below are examples of a configuration of the present disclosure, and it will be described for each illustrative aspect in order to facilitate understandings of various configurations of the present disclosure. However, each illustrative aspect does not limit the technical scope of the present disclosure, and modifications obtained by replacing or eliminating a part of the components of each illustrative aspect or adding another component, with considering the best mode of the disclosure, can be included in the technical scope of the present disclosure.

A data input device according to the illustrative aspect for an electronic device, the data input device comprising: a operation section having a flat input operation surface and a plurality of capacitive touch sensors to detect an input operation onto the input operation surface; and a control circuit section that outputs output information corresponding to detected information of the input operation input from the operation section to the electronic device when it is determined that the input operation is performed, wherein the control circuit section is configured to configure arbitrarily a detection sensitivity of the touch sensors before determining whether the input operation is performed, wherein the control circuit section determines whether the input operation is performed in response to a magnitude of an input value of the detected information, based on the configured detection sensitivity, wherein, when it is determined that the input operation is performed, the control circuit section updates the detection sensitivity configured for the touch sensors based on the magnitude of the input value of the detected information.

In the data input device according to the illustrative aspect, before determining whether the input operation is performed, the detection sensitivity of each of the touch sensors is arbitrarily configured. The control circuit section determines whether the input operation is performed based on the magnitude of the input value of the detected information and the configured detection sensitivity. Accordingly, even when there is a factor that affects an occurrence of a variation in the detection amount of the touch sensor, the touch sensor is previously adjusted to the optimal detection sensitivity, and then it is determined whether the input operation is performed. When it is determined that input operation is performed, the detection sensitivity configured for the touch sensor is updated according to the magnitude of the input value of the detected information. Accordingly, the data input device adjusts sequentially the detection sensitivity of the touch sensor to the optimal detection sensitivity for determining whether the input operation is performed.

Additionally, in this description, a method of changing the detection sensitivities includes, a method of changing a gain of a detection amount obtained by the capacitive touch sensors, a method of changing a threshold for performing whether the input operation is performed based on a magnitude of an input value of detected information, and the like, for example.

In addition to the data input device according to the above illustrative aspect, the control circuit section may be configured to configure separately a detection sensitivity for each of the plurality of the touch sensors, and wherein, when it is determined that the input operation is performed based on the separately configured detection sensitivity and the magnitude of the input value of the detected information, the control circuit section updates the separately configured detection sensitivity for each of the touch sensors according to the magnitude of the input value of the detected information. Since the data input device of this illustrative aspect configures separately the detection sensitivity for each of the plurality of the touch sensors, even when there is a factor that affects an occurrence of a variation in the detection amount of the touch sensor, the touch sensor is previously adjusted to the optimal detection sensitivity, and after that it is determined whether the input operation is performed. When it is determined that input operation is performed, the detection sensitivity configured for each of the touch sensors is updated according to the magnitude of the input value of the detected information. Accordingly, the data input device adjusts sequentially the detection sensitivity of each of the touch sensors to the optimal detection sensitivity for determining whether the input operation is performed.

In addition to the data input device according to the above illustrative aspect, the control circuit section may invalidate a detection-sensitivity change request of an arbitrary touch sensor of the plurality of the touch sensors. The data input device according to this illustrative aspect invalidates an detection-sensitivity change request of a arbitrary touch sensor of the plurality of the touch sensors so that it is invalidated that a detection-sensitivity change request of a touch sensor, in which changing a detection sensitivity from the initial configuration is undesirable. For example, if an operability of key of the touch sensor is damaged by changing the detection sensitivity, the detection-sensitivity change request is invalidated. Examples of the key, of which the detection-sensitivity change request is invalidated, include a key given a function of uniformly changing reference values of the detection sensitivities of all touch sensors of the data input device.

In addition to the data input device according to the above illustrative aspect, the control unit may include: a memory section that has a table, in which information of configurations of the sensitivities of the plurality of the touch sensors are previously defined in association with magnitudes of the input values of detected information of the input operation, and stores detected information of input operation regarding determination when it is determined that the input operation is performed; and a data processing section that updates the detection sensitivity configured for the touch sensor based on the input value of the detected information stored in the memory section, by selecting a value, which is corresponding to the magnitude of the input value of the detected information stored in the memory section, from the information regarding the configuration of the sensitivities defined in the table of the memory section. The data input device described in this illustrative aspect determines whether the input operation is performed based on the predetermined detection sensitivity. When it is determined based on the determination that input operation is performed, the data input device sequentially stores the detected information of the input operation regarding the determination in the memory section. Then, the data processing section updates the detection sensitivity configured for the touch sensor based on the input value of the detected information stored in the memory section, by selecting a value, which is corresponding to the magnitude of the input value of the detected information stored in the memory section, from the information regarding the configuration of the sensitivities defined in the table of the memory section. Accordingly, it is possible to adjust sequentially the detection sensitivity of the touch sensor to the optimal detection sensitivity for determining whether the input operation is performed.

In addition to the data input device according to the above illustrative aspect, when the input value of the detected information of the input operation reaches a predetermined magnitude, the data processing section determines that the input operation is performed, and the data processing section may output information corresponding to the detected information of the input operation to the electronic device through the control circuit section.

In a state in which the touch sensor has adjusted to the optimal detection sensitivity when the input value of the detected information of the input operation reaches a predetermined magnitude, the data processing section of the data input device described in this illustrative aspect determines that input operation is performed, and the control circuit section outputs the output information corresponding to the detected information of the input operation to the electronic device.

The data input device according to the above illustrative aspect may comprises an input-data detecting circuit that converts an analog value, which is detected information of input operation detected by the plurality of the touch sensors, into a digital value and outputs the digital value to the control circuit section, wherein the control circuit section updates the detection sensitivities configured for the touch sensors according to the magnitude of the digital value. The data input device described in this illustrative aspect converts an analog value, which is the detected information of the input operation detected by each of the plurality of the touch sensors, into a digital value. After that, the data input device changes the detection sensitivity configured for the corresponding touch sensor based on the digital value and determines whether the input operation is performed. Accordingly, it is possible to configure the detection sensitivity and to determine whether the input operation is performed, with eliminating the influence of noise.

An input control method of a data input device for an electronic device, which includes a operation section having a flat input operation surface and a plurality of capacitive touch sensors to detect an input operation onto the input operation surface; and a control circuit section that outputs output information corresponding to detected information of the input operation input from the operation section to the electronic device when it is determined that the input operation is performed, the input control method comprising: configuring arbitrarily a detection sensitivity of the touch sensor before determining whether the input operation is performed; determining whether the input operation is performed in response to a magnitude of an input value of the detected information, based on the configured detection sensitivity; updating the detection sensitivity configured for the touch sensors based on the magnitude of the input value of the detected information when it is determined that the input operation is performed.

In addition to the input control method described in the above illustrative aspect, wherein the arbitrarily configuring step may involve configuring separately a detection sensitivity for each of the plurality of the touch sensors; and wherein the updating step may involve updating the separately configured detection sensitivity for each of the touch sensors according to the magnitude of the input value of the detected information, when it is determined that the input operation is performed based on the separately configured detection sensitivity and the magnitude of the input value of the detected information.

The input control method described in the above illustrative aspect may comprise, invalidating a detection-sensitivity change request of an arbitrary touch sensor of the plurality of the touch sensors.

The input control method described in the above illustrative aspect may comprise, outputting output information corresponding to the detected information of the input operation to the electronic device through the control circuit section, when the input value of the detected information of the input operation reaches a predetermined magnitude and it is determined by the detecting that the input operation is performed.

The input control method described in the above illustrative aspect may comprise, converting an analog value, which is detected information of the input operation detected by the plurality of the touch sensors, into a digital value and outputting the digital value to the control circuit section; and wherein the updating step may involve updating the detection sensitivities configured for the touch sensors according to the magnitude of the digital value.

The effects corresponding to the data input devices of the above illustrative aspects are achieved by performing the above-mentioned steps of the input control methods described in the above illustrative aspects.

According to the above-mentioned configurations, with the data input device of the present disclosure it is possible to appropriately change the detection sensibility of touch sensors in a data input device for an electronic device using capacitive touch sensors, without damaging the reliability.

BRIEF DESCRIPTION OF THE DRAWINGS

The foregoing and additional features and characteristics of this disclosure will become more apparent from the following detailed descriptions considered with the reference to the accompanying drawings, wherein:

FIGS. 2A and 2B are flow charts illustrating an input control method of the data input device for an electric device shown in FIG. 1, specifically.

DETAILED DESCRIPTION

Hereinafter, an exemplary embodiment of the present disclosure will be described with reference to the accompanying drawings. Also, in the following description, an upward direction and a downward direction mean an upward direction and a downward direction in a state in which a data input device according to the present disclosure is flat.

Figure 1:
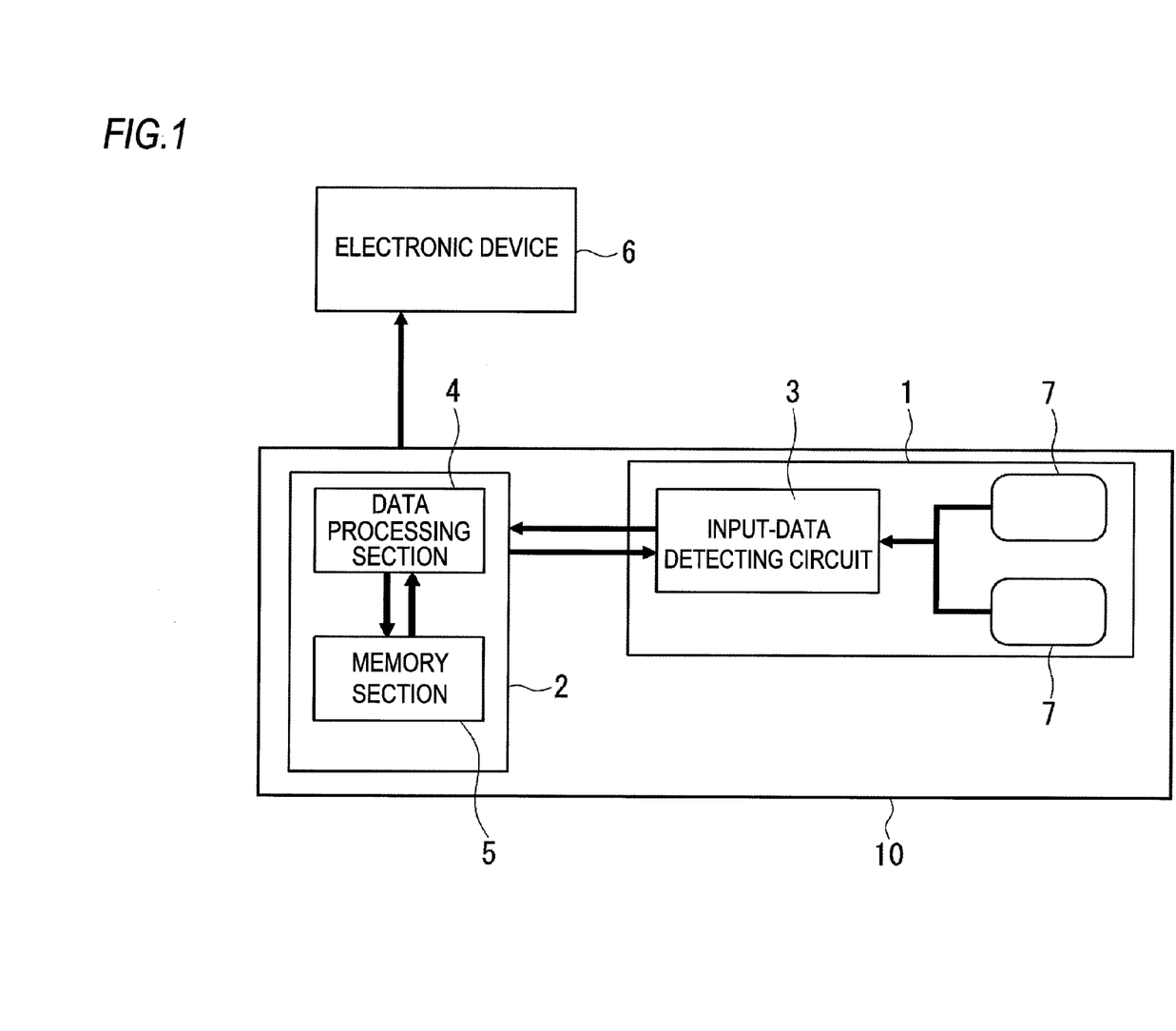
FIG. 1 is a block diagram illustrating main components of a data input device according to an exemplary embodiment of the present disclosure.

As shown in FIG. 1, a data input device 10 according to the exemplary embodiment of the present disclosure is provided for an electronic device 6, and the data input device 10 includes an operation section 1 and a control circuit section 2. The operation section 1 includes a flat input operation surface (not shown) and capacitive touch sensors 7 for detecting an input operation onto the input operation surface.

The data input device 10 according to the exemplary embodiment has a plurality of sections, each of which corresponds to keycaps of a data input device according to background art, on the input operation surface, and the touch sensors 7 are provided for the sections, respectively, so that each section functions as a key switch. Therefore, an operator of the data input device 10 performs an input operation by touching each key switch on the input operation surface with a finger or the like. Each of the touch sensors 7 is provided on a substrate disposed below the input operation surface to be disposed immediately below a corresponding section, for example.

The operation section 1 includes an input-data detecting circuit 3, which detects a change of capacitance in the touch sensor 7 and outputs detected information on the change of capacitance to the control circuit section 2. In the data input device 10, the control circuit section 2 includes a memory section 5 and a data processing section 4 as functional blocks.

The memory section 5 includes a table, in which information of sensitivity configurations of the touch sensors 7 is defined. Specifically, the information of sensitivity configurations defined in the table of the memory section 5 is optimal detection sensitivities, which are predetermined with corresponding to the capacitance detection values of the touch sensors 7 in order to determine whether the input operation is performed. For example, the information is predetermined so that it is determined that input operation is performed when a capacitance detection value of the corresponding touch sensor 7 is equal to or less than a predetermined percentage, compared that a capacitance detection value is as 100% when the operator has certainly performed the input operation on each of the touch sensors 7.

When a magnitude of an input value of the detected information reaches a predetermined value, the data processing section 4 changes a detection sensitivity of each of the touch sensors 7 to another predetermined detection sensitivity, based on the information of sensitivity configurations defined in the table of memory section 5. Then, the data processing section 4 determines whether the input operation is performed, based on the detected information and the changed detection sensitivity. When it is determined by the data processing section 4 that input operation is performed, the control circuit section 2 outputs output information corresponding to the input-operation detected information input from the operation section 1, to the electronic device 6. When it is determined that input operation is performed, the data processing section 4 controls to the memory section 5 to store sequentially the input-operation detected information regarding the determination.

Then, the data processing section 4 updates a detection sensitivity configured for the touch sensor 7 based on the magnitude of the input value of the detected information stored in the memory section 5, by selecting a value, which is corresponding to the magnitude of the input value of the detected information stored in the memory section 5, from the information of sensitivity configurations of the touch sensors 7 previously defined in the table of the memory section 5. Further, the data processing section 4 determines whether a changing request of a detection sensitivity of a touch sensor 7 relates to a detection-sensitivity-change prohibited key (a threshold-change prohibited key), which will be described below.

In the data input device 10, the control circuit section 2 may be configured as a known a microcomputer system having a central processing unit, a memory, an input/output circuit, and so on. In this case, the memory section 5 and the data processing section 4, which are the control included in the circuit unit 2 includes as the functional blocks, may be configured by arbitrary hardware or software, or a combination thereof as long as that serve the above-mentioned functions.

If necessary, the data input device 10 may include an input-data detecting circuit 3 (In FIG. 1, the input-data detecting circuit 3 is included in the operation section 1 as an example). The input-data detecting circuit converts an analog value, which is detected information of input operation detected by each of the touch sensors 7, into a digital value, and outputs the digital value to the control circuit section 2. In this case, the control circuit section 2 updates the detection sensitivity configured for each of the touch sensors 7, based on the magnitude of the digital value.

Next, with referencing FIGS. 2A, 2B and 3, the functions of the each of functional blocks and an input control method of the data input device according to the exemplary embodiment will be described.

In the following description, it will be described as an example that a method for changing a detection sensitivity, in which a threshold being a determination criterion for the data processing section 4 is changed when the data processing section 4 determines whether the input operation is performed based on a magnitude of an input value of input-operation detected information input from the operation section 1.

An input control method by the data processing section 4 of the data input device 10 according to the exemplary embodiment briefly includes: configuring arbitrarily a detection sensitivity of the touch sensor 7 before determining whether the input operation is performed; determining whether the input operation is performed in response to a magnitude of an input value of the detected information, based on the configured detection sensitivity; updating the detection sensitivity configured for the touch sensors 7 based on the magnitude of the input value of the detected information when it is determined that the input operation is performed. It is possible that an initial configuration of the detection sensitivity for each of the touch sensors 7 and a separate subsequent configuration are to be used.

Figure 2A:
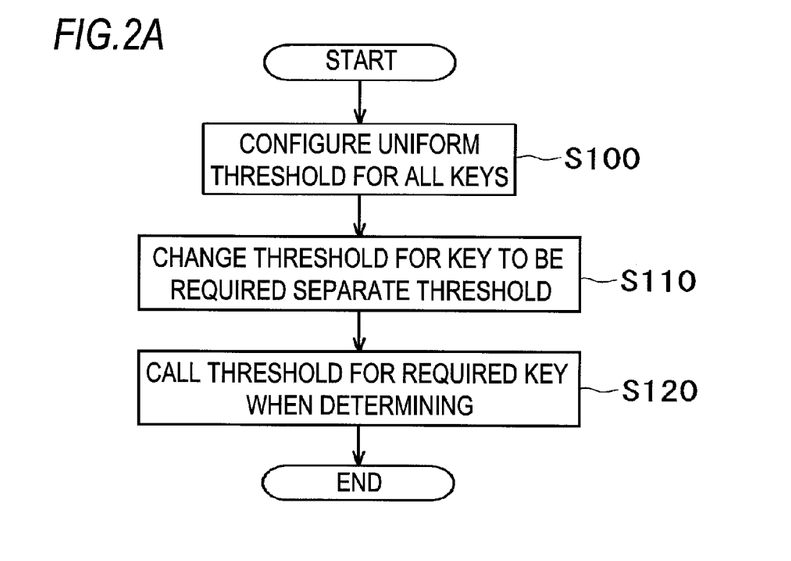
FIG. 2A is a flow chart regarding a configuration of an initial value of a detection sensibility configured for a touch sensors and FIG. 2B is a flow chart regarding a separate configuration of the detection sensibility configured for the touch sensors.

The initial configuration of the detection sensitivity for each of the touch sensors 7 is performed in a procedure shown in FIG. 2A.

First, in step S100, a uniform threshold is configured for the touch sensors 7 corresponding to all keys. At this time, the uniform threshold may be input through the touch sensor 7 by operation of the operator. Incidentally, at this time point, a detection amount (a detection value regarding capacitance) of each of the touch sensors 7 regarding each key and the uniform threshold has a relation as shown in FIG. 4.

In step S110, it is additionally and subsequently configured that a separate threshold for a touch sensor 7 corresponding to a key to be required the separate threshold for determining whether the input operation is performed. With respect to a relation between the detection amount and the separate thresholds of each of the touch sensors 7 regarding each key, a magnitude of the separate threshold of the each key is determined in response to a magnitude of the detection amounts of the touch sensors 7 regarding the each key. For example, as shown as an example in FIG. 3, detection amounts of touch sensors are large in the order of the key C, the key A, and the key B, and the separate threshold of the each key is configured to be large in the order of the key C, the key A, and the key B. In the example of FIG. 3, each separate threshold may be set as a value of about a half of a detection amount of a corresponding key.

Examples of the touch sensor corresponding to a key to be required a separate threshold includes a unique touch sensor different from other touch sensors, a touch sensor desirable to have a threshold different from general keys in view of a function given to a corresponding key, and the like.

In step S120, the data processing section 4 calls the separate threshold configured for a touch sensor 7 of a key from the table of memory section 5 when determining whether the input operation on the corresponding key has been performed based on the magnitude of the input value of the detected information. Then, the data processing section 4 outputs the output information corresponding to the detected information of the input operation, from the control circuit section 2 to the electronic device 6, only when it is determined that input operation is performed.

When it is determined that input operation is performed, the memory section 5 sequentially stores the detection amount of the touch sensor 7 regarding that determination. Then, in the data processing section 4, the threshold configured for the touch sensor 7 is updated according to the detection amount of the touch sensor 7 stored in the memory section 5. For example, the updated threshold may be also set as a value of about a half of the detection amount, as shown as an example in FIG. 3.

The method of determining whether the input operation is performed is based on comparison between a detection amount of a touch sensor 7 corresponding each key and a threshold configured for the touch sensor 7, and the data processing section 4 determines that input operation is performed when the input value of the input-operation detected information reaches a predetermined magnitude (the threshold configured for the touch sensor 7), as well known, and detailed descriptions thereof will be omitted.

Figure 2B:
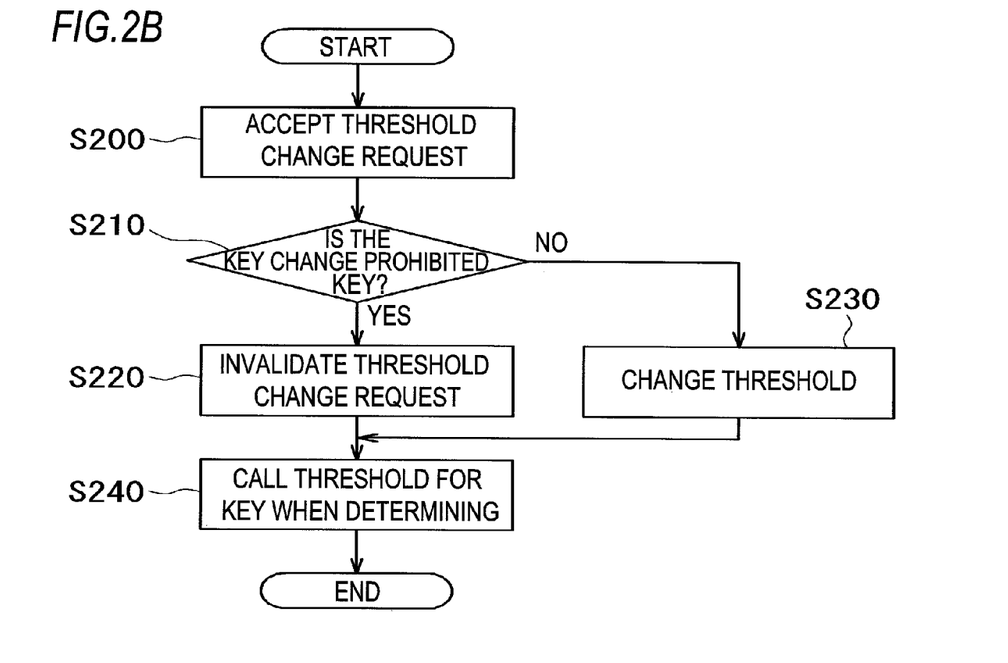

Meanwhile, the separate configuration of the detection sensitivity of each of the touch sensors 7 is performed in a procedure shown in FIG. 2B. The separate configuration of the detection sensitivity is performed based on a premise that the initial configuration of the detection sensitivity has been performed in the procedure shown in FIG. 2A.

In step S200, with respect to a touch sensor 7 corresponding to a key to be required a separate threshold, it is performed that a changing request of the separate threshold for determining whether the input operation is performed.

At this time, a new separate threshold is input through the touch sensor 7 by operation of the operator. Then, the data processing section 4 determines whether the input operation is performed based on the detection sensitivity previously configured for the touch sensor 7, and accepts the separate-threshold change request when it is determined that input operation is performed.

In step S210, the data processing section 4 determines whether the key corresponding to the touch sensor 7, of which separate-threshold change request has been accepted, is the threshold-change prohibited key. Here, the threshold-change prohibited key is a key, which is undesirable to have a threshold different from the initial configuration, in view of a function given to the corresponding key. Specifically, examples of the threshold-change prohibited key include a key, which is given a function of uniformly changing the thresholds of the touch sensors 7 regarding all keys for determining whether the input operation is performed. When the threshold of the key, which is given a function of uniformly changing the thresholds, is changed, it is feared that a change of capacitance detection value regarding the input operation of the threshold-change prohibited key may be insufficient to receive the input operation, and thus threshold change operation may be impossible.

When it is determined in step S210 that the key corresponding to the touch sensor 7, of which separate-threshold change request has been accepted, is the threshold-change prohibited key (YES in step S210), (step S220), the data processing section 4 invalidates the accepted threshold-change request.

When it is determined in step S210 that the key corresponding to the touch sensor 7, of which separate-threshold change request has been accepted, is not the threshold-change prohibited key (NO in step S210), the data processing section 4 changes the threshold based on the accepted threshold-change request in step S230.

When changing the threshold, the data processing section 4 changes the threshold to another predetermined detection sensitivity based on the information regarding the configuration of the sensitivities defined in the table of the memory section 5.

In step S240, when determining whether the input operation is performed in response to the magnitude of the input value of the detected information based on the threshold, the data processing section 4 calls the threshold (that is either of the initial threshold and the separate threshold) configured for the key for determining whether the input operation is performed from the table in the memory section 5. The data processing section 4 outputs the output information corresponding to the detected information of the operation information from the control circuit section 2 to the electronic device 6 only when it is determined that input operation is performed.

Further, when it is determined that input operation is performed, the memory section 5 stores sequentially the detection amount of the touch sensor 7 regarding the determination. Then, the data processing section 4 updates the threshold configured for the touch sensor 7 based on the stored detection amount of the touch sensor 7. The updated threshold is set to, for example, a value of about a half of the detection amount, as shown as an example in FIG. 3.

According to the exemplary embodiment of the present disclosure having the above-mentioned configuration, it is possible to achieve the following effects.

First, the data input device 10 according the exemplary embodiment configures arbitrarily the detection sensitivity (threshold) of each of the touch sensors 7 (steps S100 and S110 of FIG. 2A and steps S200 and S230 of FIG. 2B) before determining whether the input operation is performed, in the control circuit section 2. The data input device 10 determines whether the input operation is performed in response to the magnitude of the input value of the detected information based on the configured detection sensitivity (threshold). Therefore, even when there is a factor that affects an occurrence of a variation in the detection amount of the touch sensor 7, the touch sensor 7 is previously adjusted to the optimal detection sensitivity (threshold), and then it is determined whether the input operation is performed. When it is determined that input operation is performed, the detection sensitivity (threshold) configured for the touch sensor 7 is updated according to the magnitude of the input value of the detected information. Therefore, it is possible to adjust sequentially the detection sensitivity (threshold) of the touch sensor 7 to the optimal detection sensitivity (threshold) for determining whether the input operation is performed.

Figure 3:
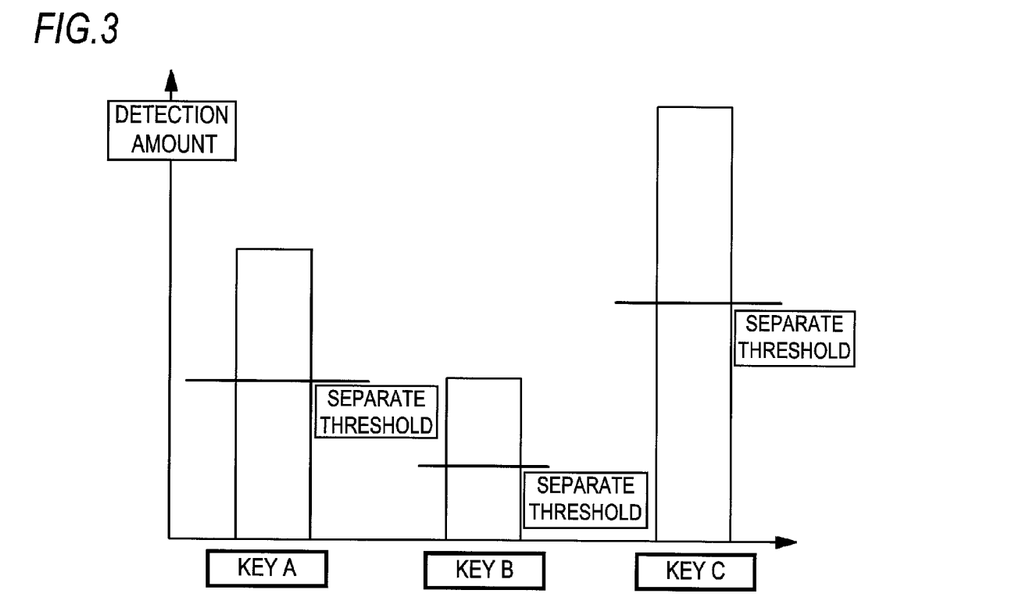
FIG. 3 is an explanatory diagram illustrating a example of a detection sensitivity configured for the touch sensors of the data input device for an electric device according to the exemplary embodiment shown in FIG. 1.

Further, the data input device 10 according to the exemplary embodiment separately configures the detection sensitivity (threshold) for each of the plurality of the touch sensors 7 (FIG. 3). Therefore, even when there is a factor that affects an occurrence of a variation in the detection amount of the touch sensor 7, the touch sensor 7 is previously adjusted to the optimal detection sensitivity (threshold), and then it is determined whether the input operation is performed. When it is determined that input operation is performed, the detection sensitivity configured for each of the touch sensors 7 is updated according to the magnitude of the input value of the detected information. Therefore, it is possible to adjust sequentially the detection sensitivity of each of the touch sensors 7 to the optimal detection sensitivity for determining whether the input operation is performed.

Furthermore, the input device 10 according to the exemplary embodiment can avoid the problem that is occurred by changing the configuration of the detection sensitivity of the touch sensors which is undesirable to change the detection sensitivity from the initial configuration such that the changing request of detection sensitivity of an arbitrary touch sensor 7 of the plurality of touch sensors 7 is invalidated (steps S210 and S220 of FIG. 2B).

Moreover, the data input device 10 determines whether the input operation is performed based on the predetermined detection sensitivity (step S120 of FIG. 2A and step S240 of FIG. 2B). When it is determined that input operation is performed, the data input device 10 sequentially stores the detected information of the input operation regarding the determination in the memory section 5. Then, the data processing section 4 updates a detection sensitivity configured for the touch sensor 7 based on the magnitude of the input value of the detected information stored in the memory section 5, by selecting value, which is corresponding to the magnitude of the input value of the detected information stored in the memory section 5, from the information of sensitivity configurations of the touch sensors 7 previously defined in the table of the memory section 5. Therefore, it is possible to adjust sequentially the detection sensitivity (threshold) of the touch sensor 7 to the optimal detection sensitivity (threshold) for determining whether the input operation is performed.

Then, in a state in which the touch sensor 7 has the adjusted optimal detection sensitivity (threshold) (step S120 of FIG. 2A and step S240 of FIG. 2B) when the input value of the detected information of the input operation reaches a predetermined magnitude, the data processing section 4 determines that input operation is performed, and the data processing section 4 outputs the output information corresponding to the detected information of the input operation to the electronic device 6 through the control unit 2.

Moreover, the data input device 10 according to the exemplary embodiment converts an analog value, which is the detected information of the input operation detected by each of the plurality of the touch sensors 7, into a digital value. After that, the data input device changes the detection sensitivity configured for the corresponding touch sensor based on the digital value and determines whether the input operation is performed. Accordingly, it is possible to configure the detection sensitivity and to determine whether the input operation is performed, with eliminating the influence of noise.

Although it has been described as an example of the method for changing a detection sensitivity, in which a threshold being a determination criterion for the data processing section 4 is changed in response to a magnitude of an input value of input-operation detected information input from the operation section 1 when the data processing section 4 determines whether the input operation is performed, a detection sensitivity may be changed by changing a gain of a detection amount obtained by a touch sensor 7. In this case, when a detection sensitivity is changed, a gain change command may be output to the input-data detecting circuit 3 based on information for gain adjustment defined in a table of the memory section 5 included in the data input device 10 shown in FIG. 1.

What is claimed is:

1. A data input device for an electronic device, comprising:
    an operation section having a flat input operation surface and a plurality of capacitive touch sensors to detect a input operation onto the input operation surface; and
    a control circuit section that outputs output information corresponding to detected information of the input operation input from the operation section to the electronic device when it is determined that the input operation is performed,
    wherein the control circuit section is configured to configure arbitrarily detection sensitivity of the touch sensors before determining whether the input operation is performed,
        wherein the control circuit section determines whether the input operation is performed in response to a magnitude of an input value of the detected information, based on the configured detection sensitivity, and
        wherein, when it is determined that the input operation onto one of the touch sensors is performed, the control circuit section updates the detection sensitivity configured for said one of the touch sensors based on the magnitude of the input value of the input operation onto said one of the touch sensors,
        wherein, the control circuit section is configured to configure separately a plurality of detection sensitivities, each of which is independent from the other detection sensitivities, for the plurality of the touch sensors, respectively, based on respective detected input values of each of the touch sensors, and
        wherein, when it is determined that the input operation is performed based on the separately configured detection sensitivity of at least one of the touch sensors and the magnitude of the input value of the detected information, the control circuit section updates the separately configured detection sensitivity for the at least one of the touch sensors according to the magnitude of the input value of the detected information.

2. The data input device according to claim 1,
    wherein the control circuit section invalidates a detection-sensitivity change request of an arbitrary touch sensor of the plurality of the touch sensors.

3. The data input device according to claim 1,
    wherein the control unit includes:
        a memory section that has a table, in which information of configurations of the sensitivities of the plurality of the touch sensors are previously defined in association with magnitudes of the input values of detected information of the input operation, and stores detected information of input operation regarding determination when it is determined that the input operation is performed; and
        a data processing section that updates the detection sensitivity configured for any given one of the touch sensors based on the input value of the detected information stored in the memory section, by selecting a value, which corresponds to the magnitude of the input value of the detected information stored in the memory section, from the information regarding the configuration of the sensitivities defined in the table of the memory section.

4. The data input device according to claim 3,
    wherein, when the input value of the detected information of the input operation reaches a predetermined magnitude, the data processing section determines that the input operation is performed, and the data processing section outputs output information corresponding to the detected information of the input operation to the electronic device through the control circuit section.

5. The data input device according to claim 1, further comprising:
    an input-data detecting circuit that converts an analog value, which is detected information of input operation detected by the plurality of the touch sensors, into a digital value and outputs the digital value to the control circuit section,
    wherein the control circuit section updates the detection sensitivities configured for the touch sensors according to the magnitude of the digital value.

6. An input control method of a data input device for an electronic device, which includes an operation section having a flat input operation surface and a plurality of capacitive touch sensors to detect an input operation onto the input operation surface; and a control circuit section that outputs output information corresponding to detected information of the input operation input from the operation section to the electronic device when it is determined that the input operation is performed, the input control method comprising the steps of:
    configuring arbitrarily a detection sensitivity of the touch sensors before determining whether the input operation is performed;
    determining whether the input operation is performed in response to a magnitude of an input value of the detected information, based on the configured detection sensitivity; and updating the detection sensitivity configured for one of the touch sensors based on the magnitude of the input value of the input operation onto said one of the touch sensors when it is determined that the input operation onto said one of the touch sensors is performed, wherein the arbitrarily configuring step involves configuring separately a plurality of detection sensitivities, each of which is independent from the other detection sensitivities, for the plurality of the touch sensors, respectively, based on respective detected input values of each of the touch sensors, and wherein the updating step involves updating the separately configured detection sensitivity for at least one of the touch sensors according to the magnitude of the input value of the detected information, when it is determined that the input operation is performed based on the separately configured detection sensitivity of the at least one of the touch sensors and the magnitude of the input value of the detected information.

7. The input control method according to claim 6, further comprising the step of:

invalidating a detection-sensitivity change request of an arbitrary touch sensor of the plurality of the touch sensors.

8. The input control method according to claim 6, further comprising the steps of:

determining whether the input operation is performed when the input value of the detected information reaches a predetermined magnitude; and outputting output information corresponding to the detected information of the input operation to the electronic device through the control circuit section.

9. The input control method according to claim 6, further comprising the steps of:

converting an analog value, which is detected information of input operation detected by the plurality of the touch sensors, into a digital value and outputting the digital value to the control circuit section, and wherein the updating step involves updating the detection sensitivity configured for one of the touch sensors according to the magnitude of the digital value.

10. A data input device for an electronic device, comprising:

an operation section having a flat input operation surface and a plurality of capacitive touch sensors to detect a input operation onto the input operation surface; and a control circuit section that outputs output information corresponding to detected information of the input operation input from the operation section to the electronic device when it is determined that the input operation is performed, wherein the control circuit section is configured to configure arbitrarily detection sensitivity of the touch sensors before determining whether the input operation is performed, wherein the control circuit section determines whether the input operation is performed in response to a magnitude of an input value of the detected information, based on the configured detection sensitivity, and wherein, when it is determined that the input operation onto one of the touch sensors is performed, the control circuit section updates the detection sensitivity configured for said one of the touch sensors based on the magnitude of the input value of the input operation onto said one of the touch sensors, wherein the control unit includes:

a memory section that has a table, in which information of configurations of the sensitivities of the plurality of the touch sensors are previously defined in association with magnitudes of the input values of detected information of the input operation, and stores detected information of input operation regarding determination when it is determined that the input operation is performed; and a data processing section that updates the detection sensitivity configured for any given one of the touch sensors based on the input value of the detected information stored in the memory section, by selecting a value, which corresponds to the magnitude of the input value of the detected information stored in the memory section, from the information regarding the configuration of the sensitivities defined in the table of the memory section.

11. The data input device according to claim 10, wherein the control circuit section invalidates a detection-sensitivity change request of an arbitrary touch sensor of the plurality of the touch sensors.

12. The data input device according to claim 10, wherein, when the input value of the detected information of the input operation reaches a predetermined magnitude, the data processing section determines that the input operation is performed, and the data processing section outputs output information corresponding to the detected information of the input operation to the electronic device through the control circuit section.

13. The data input device according to claim 10, further comprising:

an input-data detecting circuit that converts an analog value, which is detected information of input operation detected by the plurality of the touch sensors, into a digital value and outputs the digital value to the control circuit section, wherein the control circuit section updates the detection sensitivities configured for the touch sensors according to the magnitude of the digital value.

* * * * *